United States Patent
Chen et al.

(10) Patent No.: US 12,265,412 B2
(45) Date of Patent: *Apr. 1, 2025

(54) LOW DROPOUT REGULATOR CIRCUITS, INPUT/OUTPUT DEVICE, AND METHODS FOR OPERATING A LOW DROPOUT REGULATOR

(71) Applicant: Taiwan Semiconductor Manufacturing Company, Ltd., Hsinchu (TW)

(72) Inventors: Huan-Neng Chen, Taichung (TW); Yen-Lin Liu, Taichung (TW); Chia-Wei Hsu, New Taipei (TW); Jo-Yu Wu, Hsinchu (TW); Chang-Fen Hu, Hsinchu (TW); Shao-Yu Li, Hsinchu (TW); Bo-Ting Chen, Fengyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/633,481

(22) Filed: Apr. 11, 2024

(65) Prior Publication Data
US 2024/0255977 A1 Aug. 1, 2024

Related U.S. Application Data

(63) Continuation of application No. 17/650,668, filed on Feb. 11, 2022, now Pat. No. 11,966,241.

(60) Provisional application No. 63/220,331, filed on Jul. 9, 2021.

(51) Int. Cl.
 *G05F 1/575* (2006.01)
 *G05F 1/595* (2006.01)
 *H03K 19/0175* (2006.01)

(52) U.S. Cl.
 CPC .............. *G05F 1/595* (2013.01); *G05F 1/575* (2013.01); *H03K 19/017509* (2013.01)

(58) Field of Classification Search
 CPC .................. G05F 1/595; G05F 1/575
 See application file for complete search history.

(56) References Cited

U.S. PATENT DOCUMENTS

| | | |
|---|---|---|
| 8,598,854 B2 | 12/2013 | Soenen et al. |
| 9,261,892 B2 | 2/2016 | Wang et al. |
| 9,323,263 B2 | 4/2016 | Jain et al. |
| 9,625,926 B1 | 4/2017 | Hoque |

(Continued)

FOREIGN PATENT DOCUMENTS

| | | |
|---|---|---|
| CN | 1480929 A | 3/2004 |
| CN | 103309386 A | 9/2013 |

(Continued)

*Primary Examiner* — Sisay G Tiku
(74) *Attorney, Agent, or Firm* — Finnegan, Henderson, Farabow, Garrett & Dunner, L.L.P.

(57) ABSTRACT

A circuit includes a voltage divider circuit configured to generate a feedback voltage according to an output voltage, an operational amplifier configured to output a driving signal according to the feedback voltage and a reference voltage and a pass gate circuit including multiple current paths. The current paths are controlled by the driving signal and connected in parallel between the voltage divider circuit and a power reference node.

19 Claims, 11 Drawing Sheets

(56) References Cited

U.S. PATENT DOCUMENTS

| | | | |
|---|---|---|---|
| 9,734,904 B1* | 8/2017 | Cho | G05F 3/24 |
| 9,841,777 B2 | 12/2017 | Enjalbert et al. | |
| 10,310,530 B1* | 6/2019 | Lu | G05F 1/468 |
| 11,029,716 B1 | 6/2021 | Chan et al. | |
| 11,703,896 B2* | 7/2023 | Tseng | G05F 1/468 |
| | | | 323/280 |
| 2005/0068092 A1 | 3/2005 | Sano | G05F 1/575 |
| | | | 327/541 |
| 2007/0262810 A1 | 11/2007 | Lee et al. | |
| 2009/0322295 A1 | 12/2009 | Scoones et al. | |
| 2010/0214000 A1 | 8/2010 | Crespi et al. | |
| 2012/0176109 A1 | 7/2012 | Riederer | |
| 2012/0242372 A1 | 9/2012 | Kollmann | |
| 2013/0265807 A1* | 10/2013 | Lee | G05F 1/468 |
| | | | 363/49 |
| 2014/0117958 A1* | 5/2014 | Price | G05F 1/468 |
| | | | 323/281 |
| 2015/0015223 A1* | 1/2015 | Chen | G05F 1/575 |
| | | | 323/280 |
| 2016/0048148 A1 | 2/2016 | Lee et al. | |
| 2016/0118986 A1 | 4/2016 | Kumar et al. | |
| 2016/0149486 A1 | 5/2016 | Roth et al. | |
| 2019/0163219 A1 | 5/2019 | Kim et al. | |
| 2021/0255653 A1 | 8/2021 | Setiawan et al. | |
| 2021/0336620 A1* | 10/2021 | Lin | H03K 3/012 |
| 2021/0391795 A1 | 12/2021 | Gandhi et al. | |
| 2022/0404852 A1 | 12/2022 | Jung et al. | |
| 2023/0130268 A1 | 4/2023 | Ruta et al. | |
| 2023/0236615 A1 | 7/2023 | Pang et al. | |
| 2024/0161816 A1* | 5/2024 | Kim | G11C 11/4096 |

FOREIGN PATENT DOCUMENTS

| | | |
|---|---|---|
| CN | 103941798 A | 7/2014 |
| CN | 106796326 A | 5/2017 |
| CN | 107102665 A | 8/2017 |
| CN | 209659177 U | 11/2019 |
| CN | 110556142 A | 12/2019 |
| JP | S 639222 A | 1/1988 |
| JP | 6886544 B1 | 6/2021 |
| TW | 201945748 A | 12/2019 |

* cited by examiner

LOW DROPOUT REGULATOR CIRCUITS, INPUT/OUTPUT DEVICE, AND METHODS FOR OPERATING A LOW DROPOUT REGULATOR

REFERENCE TO RELATED APPLICATION

This application is a continuation application of U.S. Non-provisional patent application Ser. No. 17/650,668, filed on Feb. 11, 2022, which claims the benefit of U.S. Provisional Application No. 63/220,331, filed on Jul. 9, 2021, entitled "SWITCHABLE LOW DROPOUT REGULATOR," all of which are incorporated herein by reference in their entireties.

BACKGROUND

Voltage regulators can be used to provide a supply voltage independent of load impedance, input voltage variations, or temperature variations. For example, a low dropout (LDO) voltage regulator is a type of voltage regulator that provides a small input-to-output differential voltage to maintain the regulation with small differences between the input and the output voltages of the LDO regulator. In various applications in electronic devices, LDO regulators are used to provide a stable power supply.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1:
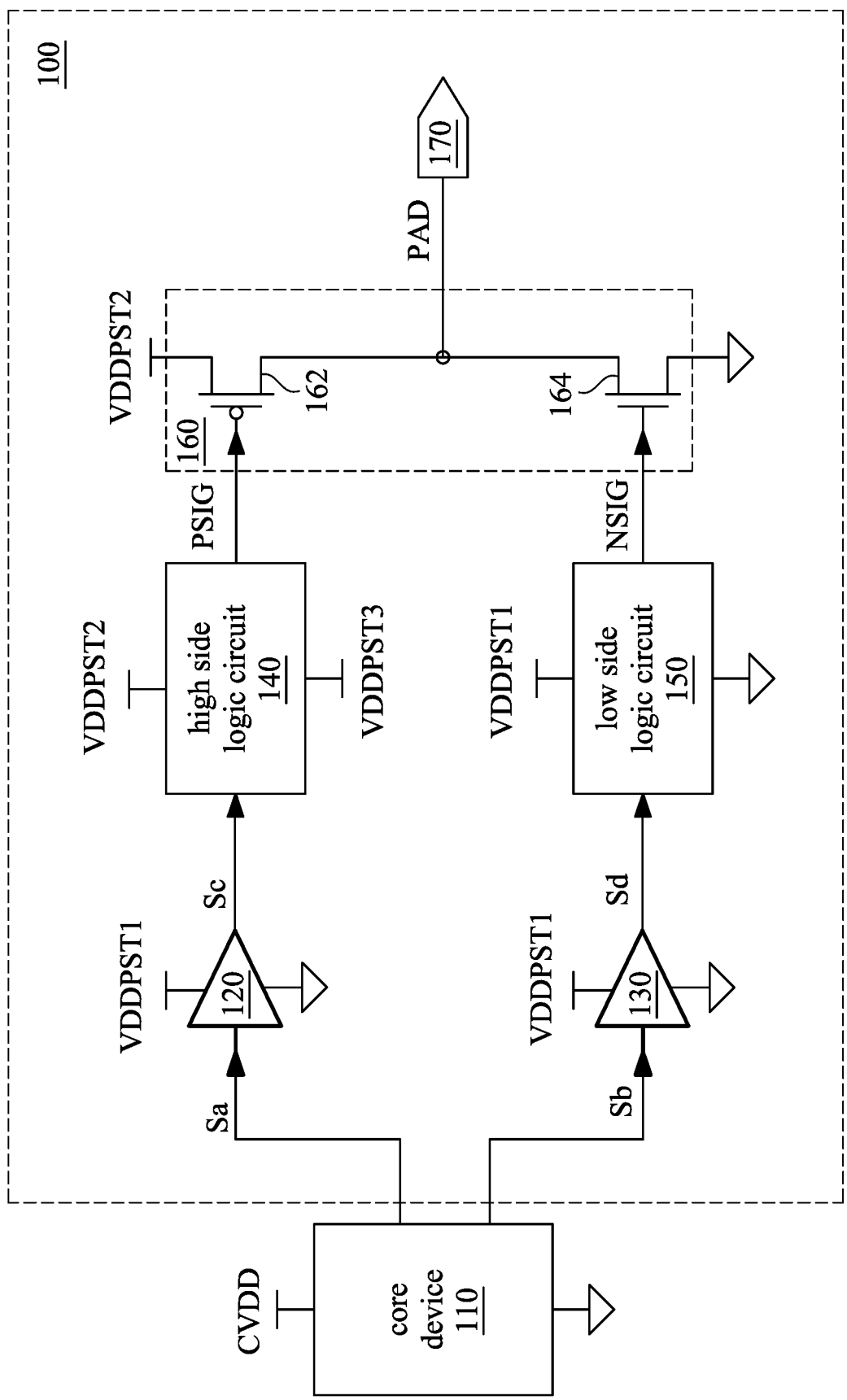
FIG. 1 is a diagram illustrating an exemplary input/output (I/O) device, in accordance with some embodiments of the present disclosure.

The following disclosure provides many different exemplary embodiments, or examples, for implementing different features of the provided subject matter. Specific simplified examples of components and arrangements are described below to explain the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected." "Coupled" and "connected" may also be used to indicate that two or more elements cooperate or interact with each other.

Various embodiments of the present disclosure will be described with respect to embodiments in a specific context, namely a low dropout regulator (LDO). The term "dropout" refers to a minimum difference between an input voltage and an output voltage required for proper regulation. Integrated LDO regulators are widely used in integrated circuit (IC) applications. LDO regulators are rated in terms of performance metrics, including drop-out voltage, standby current, load regulation, line regulation, maximum current, speed (responsiveness in the presence of varying loads), and output voltage variations (e.g., undershoot and overshoot)

due to transients in load current. The concepts in the disclosure may also apply, however, to other circuits or semiconductor structures.

FIG. 1 is a diagram illustrating an exemplary input/output ("I/O") device 100 in an integrated circuit (IC), in accordance with some embodiments of the present disclosure. As shown in FIG. 1, the I/O device 100 communicates with a core device 110 in the integrated circuit. The I/O device 100 may include level shifter circuits 120 and 130, a high side logic circuit 140, a low side logic circuit 150, a post driver circuit 160, and a pad 170 for outputting the output signal PAD.

In some embodiments, the core device 110 can be a device formed on a die to provide high speed digital circuits, and generally operate faster and use lower voltages. For example, the core device 110 is configured to receive an internal core supply voltage CVDD, which may be lower than the I/O voltages for the I/O device 100. Circuits in the core device 110 have higher density and may be more susceptible to being damaged by electrostatic discharge (ESD).

The I/O device 100 is configured to transfer signals between the core device 110 and component connections having large capacitances, which often require a larger driving power and voltage than the signaling occurring within the core device 110 in the integrated circuit die. Accordingly, the I/O device 100 may transfer the signals at higher voltages than the internal core supply voltage CVDD.

For example, in some embodiments, the core supply voltage CVDD within the logic circuits of the core device 110 can be approximately 0.85 V, 0.9 V, 1.0 V, 1.05 V, and the like, while the I/O device 100 can be at higher voltage power domains, such as 1.5 V, 1.8 V, 2.5 V, 3.3 V, etc. For example, in some embodiments, the power supply voltage VDDPST1 for the level shifter circuits 120 and 130 and the low side logic circuit 150 is about 1.2 V, and the power supply voltage VDDPST2, which may be the I/O voltage VDDIO of the I/O device 100, for the high side logic circuit 140 and the post driver circuit 160 is about 1.8 V. The lower supply voltage VDDPST3 for the high side logic circuit 140 is about 0.6 V.

For example, in some embodiments, the I/O voltage VDDIO may be 1.8 V and include under-drive (UD) and over-drive (OD) variations, such as 1.8V UD 1.2V, 1.8V UD 1.5V. In other embodiments, the I/O voltage VDDIO is 2.5 V I/O and includes under-drive (UD) and over-drive (OD) variations, such as 2.5V UD 1.8V, 2.5V OD 3.3V. In further embodiments, the I/O voltage VDDIO is the 1.2V±5% specified by JEDEC for Wide I/O or Wide I/O 2. The core voltage CVDD, the I/O voltage VDDIO, and the power supply voltages VDDPST1, VDDPST2, and VDDPST3 stated in this disclosure are exemplary, and other voltages are contemplated within the scope of the disclosure.

The level shifter circuits 120 and 130 are respectively configured to level-shift signals Sa and Sb within a first voltage range, such as the core voltage range, received from the core device 110 to corresponding signals Sc and Sd within a second voltage range, such as a larger I/O voltage range, for multi-protocol IO interfaces. The level shifter circuits 120 and 130 are respectively connected to the post driver circuit 160, which may include a PMOS transistor 162 and a NMOS transistor 164, via the high side logic circuit 140 and the low side logic circuit 150, respectively. In some embodiments, the high side logic circuit 140 and the low side logic circuit 150 form a decoding circuit to generate corresponding switching signals PSIG and NSIG for driving the PMOS transistor 162 and the NMOS transistor 164 in the post driver circuit 160 in response to the level-shifted signals Sc and Sd.

As shown in the embodiments of FIG. 1, the high side logic circuit 140 and the low side logic circuit 150 may have different power supply voltage levels. For example, the supply of the low side logic circuit 150 may be a power supply voltage VDDPST1, and the low reference voltage of the low side logic circuit 150 may be a system ground. The supply of the high side logic circuit 140 may be another supply voltage VDDPST2, and the low reference voltage of the high side logic circuit 140 may be yet another supply voltage VDDPST3. In some embodiments, the high side logic circuit 140 and the low side logic circuit 150 may include buffer or inverter circuits to generate corresponding switching signals PSIG and NSIG in response to the level-shifted signals Sc and Sd from the level shifter circuits 120 and 130. Accordingly, in response to the switching signals PSIG and NSIG received from the high side logic circuit 140 and the low side logic circuit 150, the post driver circuit 160 may output proper I/O signals (e.g., output signal PAD) to the pad 170.

Particularly, in the embodiments of FIG. 1, the post driver circuit 160 is coupled between a power supply line having the power supply voltage VDDPST2 (e.g., about 1.8V) and the system ground, which may be equal to about 0 V. In some embodiments, the post driver circuit 160 may also be configured to receive one or more mid-level voltages, such as the power supply voltages VDDPST1 (e.g., about 1.2 V) and VDDPST3 (e.g., about 0.6 V), which are lower than the power supply voltage VDDPST2. The post driver circuit 160 can deliver a large amount of current to drive an output load via the pad 170 connected to the post driver circuit 160. For example, the post driver circuit 160 may drive the output load in a PC board.

In some embodiments, the post driver circuit 160 includes one or more serially-coupled p-type transistors, and one or more serially-coupled n-type transistors coupled in a cascade inverter configuration. As shown in FIG. 1, a gate of the PMOS transistor 162 receives the switching signal PSIG from the high side logic circuit 140, and a gate of the NMOS transistor 164 receives the driving signal NSIG from the low side logic circuit 150. Accordingly, the post driver circuit 160 can generate the output signal PAD to the pad 170 based on the received switching signals PSIG and NSIG. In some embodiments, the output signal PAD may, approximately, swing between 0 V and the power supply voltage VDDPST2 and provide communications between the I/O device 100 and other external circuits or devices.

In some embodiments, to implement the I/O device 100 for high voltage applications in the advanced process node, a linear regulator, such as a Low dropout regulator (LDO regulator), can be used for the I/O device 100 to supply the intermediate voltages, such as the power supply voltages VDDPST1 and VDDPST3, and monitor the voltage levels accordingly to provide stable power supply. The LDO regulator is configured to output a steady voltage as the power supply voltages VDDPST1 and VDDPST3 according to the power supply voltage VDDPST2, and is able to operate at a low potential difference between the input and the output, which will be discussed in more detail below.

Figure 2:
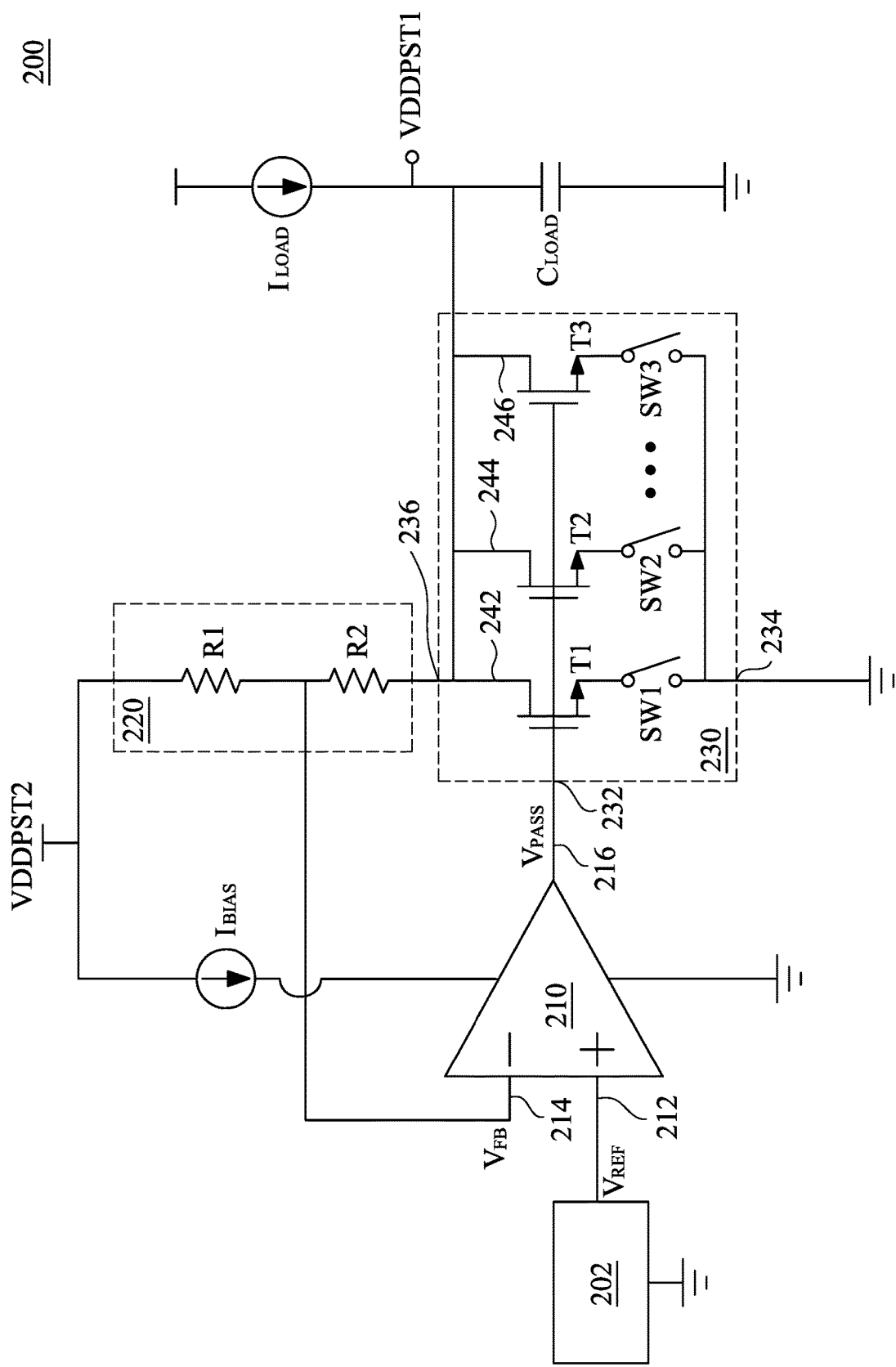
FIG. 2 is a diagram illustrating an exemplary low dropout (LDO) circuit, in accordance with some embodiments of the present disclosure.

FIG. 2 is a diagram illustrating an exemplary LDO circuit 200 for providing intermediate voltages for the I/O device 100 of FIG. 1, in accordance with some embodiments of the present disclosure. The LDO circuit 200 is configured to output the power supply voltage VDDPST1 according to the power supply voltage VDDPST2, and keep the power supply voltage VDDPST1 steady by adjusting the dropout voltage of the LDO circuit 200, with a varying load current $I_{LOAD}$, which is an equivalent average current of the I/O device 100. As shown in FIG. 2, the LDO circuit 200 may be an n-channel MOS (NMOS) LDO. In the case of the NMOS architecture, the LDO circuit 200 includes a reference voltage supply circuit 202 for generating a reference voltage $V_{REF}$, an operational amplifier 210, a voltage divider circuit 220, and a switchable pass gate circuit 230 having multiple legs 242, 244, and 246. The switchable pass gate circuit 230 may provide multiple current paths via legs 242, 244, and 246. Legs 242, 244, and 246 respectively include NMOS transistors T1, T2, T3 and switches SW1, SW2, and SW3. The switches SW1, SW2, and SW3 are respectively coupled to the corresponding NMOS transistors T1, T2, T3 in series to form the current paths, which may be enabled or disabled separately by turning on or off the switches SW1, SW2, and SW3. The current flowing through the enabled current path(s) is controlled by the gate signal $V_{PASS}$ outputted by the operational amplifier 210. As shown in FIG. 2, the current paths of the legs 242, 244, and 246 are connected in parallel between the voltage divider circuit 220 and a power reference node, such as the system ground.

In order to regulate a desired output voltage as the power supply voltage VDDPST1, the operational amplifier 210, the voltage divider circuit 220, and the switchable pass gate circuit 230 form a feedback loop to control an overall drain-to-source resistance ($R_{DS}$) of the switchable pass gate circuit 230. As the input voltage (e.g., the power supply voltage VDDPST2) approaches a desired output voltage (e.g., the power supply voltage VDDPST1), the operational amplifier 210 is configured to increase the gate-to-source voltage ($V_{GS}$) by adjusting the gate signal $V_{PASS}$ to lower the drain-to-source resistance ($R_{DS}$) to maintain the regulation. When the output of the operational amplifier 210 saturates at the power supply voltage, the drain-to-source resistance ($R_{DS}$) is at the minimum value as the gate-to-source voltage ($V_{GS}$) reaches the maximum value.

In addition, the switches SW1, SW2, and SW3 within the switchable pass gate circuit 230 can be turned on or off separately to shift the driving capability of the switchable pass gate circuit 230. Particularly, when different numbers of switches SW1, SW2, and SW3 are on, corresponding one or more NMOS transistors T1, T2 and T3 are coupled in parallel between the ground and the output node of the LDO circuit 200. Accordingly, the operational amplifier 210 can output the gate signal $V_{PASS}$ to drive the parallel-coupled NMOS transistors T1, T2 and T3 to adjust the total drain-to-source resistance ($R_{DS}$) and keep the power supply voltage VDDPST1 stable. By adjusting the number of NMOS transistors T1, T2 and T3 being used to provide different current paths, the driving capability can be switched accordingly, achieving the regulation without operating with a wide voltage range of the gate signal $V_{PASS}$. In addition, the switchable pass gate circuit 230 avoids potential leakage path in the LDO circuit 200, which allows for a reduction in the leakage current in the LDO circuit 200 and the power loss.

In the embodiments of FIG. 2, the operational amplifier 210 has a first input terminal 212, a second input terminal 214, and a single-ended output terminal 216. The first input terminal 212 is coupled to the reference voltage supply circuit 202, enabling the first input terminal 212 to receive the reference voltage $V_{REF}$. The second input terminal 214 is coupled to an input node receiving the power supply voltage VDDPST2 via a feedback resistor R1, and is coupled to an output node of the LDO circuit 200 via another feedback resistor R2.

The feedback resistors R1 and R2 coupled in series form the voltage divider circuit 220 and are configured to scale the output voltage (e.g., the power supply voltage VDDPST1) to provide a feedback voltage $V_{FB}$ in the feedback loop to the second input terminal 214 (e.g., a negative input terminal) of the operational amplifier 210. Accordingly, the voltage divider circuit 220 generates the feedback voltage $V_{FB}$ according to the output voltage. The operational amplifier 210 compares the feedback voltage $V_{FB}$ with the reference voltage $V_{REF}$ received from the first input terminal 212 (e.g., a positive input terminal) of the operational amplifier 210 and amplifies the error detected between the feedback voltage $V_{FB}$ with the reference voltage $V_{REF}$. Thus, the operational amplifier 210 may output the gate signal $V_{PASS}$ as a driving signal according to the feedback voltage $V_{FB}$ and the reference voltage $V_{REF}$. By the feedback loop, when the power supply voltage VDDPST1 deviates from the desired value, the operational amplifier 210 is configured to drive the switchable pass gate circuit 230 to bring the power supply voltage VDDPST1 back to the proper value.

The output terminal 216 of the operational amplifier 210 is coupled to the switchable pass gate circuit 230. Particularly, the switchable pass gate circuit 230 includes a control electrode 232 that is coupled to the output terminal 216 of the operational amplifier 210. The switchable pass gate circuit 230 includes a first electrode 234 connected to the system ground and a second electrode 236 connected to the output node of the LDO circuit 200. In the embodiments of FIG. 2, the switchable pass gate circuit 230 includes the NMOS transistors T1, T2 and T3, such that the control electrode 232 is coupled to gate terminals of the NMOS transistors T1, T2 and T3, and the first electrode 234 and the second electrode 236 are coupled to source terminals and drain terminals of the NMOS transistors T1, T2 and T3. It should be understood that the n-type MOS transistors used in FIG. 2 is exemplary only, and that in other examples, p-type MOS transistors or another type of transistor may be used as pass transistors, which may also be known as power transistors, in the switchable pass gate circuit 230.

Accordingly, the feedback voltage $V_{FB}$ present at the second input terminal 214 is a fraction of the power supply voltage VDDPST1 outputted by the LDO circuit 200. The fraction is determined based on a ratio of resistance values of the feedback resistors R1 and R2. By comparing the feedback voltage $V_{FB}$ to the reference voltage $V_{REF}$, the operational amplifier 210 is configured to output the gate signal $V_{PASS}$ to drive the switchable pass gate circuit 230 to an appropriate operating point that ensures the power supply voltage VDDPST1 at the output node is at a proper voltage. When the operating current or other conditions change, the operational amplifier 210 modulates, through the gate signal $V_{PASS}$, the switchable pass gate circuit 230 to maintain the proper voltage.

In addition, in response to the changes of the operating current or other conditions, the switchable pass gate circuit 230 may be configured to select and provide one or more current paths by enabling or disabling corresponding one or more switches SW1, SW2, and SW3 coupled to the NMOS transistors T1, T2 and T3, to adjust the driving capacity of the switchable pass gate circuit 230. Accordingly, the gate signal $V_{PASS}$ outputted from the operational amplifier 210 can be controlled within a predetermined desired range when the operating current or other conditions change. Similarly, an overdrive voltage of the power transistors (e.g., the NMOS transistors T1, T2 and T3) in the switchable pass gate circuit 230 is also controlled within a desired range. The overdrive voltage is defined as the gate-source voltage of the power transistor in excess of the threshold voltage ($V_{TH}$) of the power transistor. The threshold voltage $V_{TH}$ is defined as the minimum voltage required between the gate and the source to turn on the power transistor, allowing the corresponding power transistor to provide the current path. For example, in some embodiments, an optimized operating point of the power transistors can provide an overdrive voltage of 0.2V, with the range of the overdrive voltage falling between 0.1V-0.3V.

Alternatively stated, the switchable pass gate circuit 230 is configured to operate in different modes, and the switches SW1-SW3 in different current paths are separately turned on or off according to a selected operating mode. When operated in different modes, the LDO circuit 200 may provide different driving capacity under the maximum switching speed.

As shown in FIG. 2, the LDO circuit 200 includes an auxiliary rail, providing a bias voltage ($V_{BIAS}$) and a bias current $I_{BIAS}$ for the operational amplifier 210. In some embodiments, the auxiliary rail can serve as a positive supply rail for the operational amplifier 210, which allows the output terminal 216 of the operational amplifier 210 to swing up to the bias voltage $V_{BIAS}$. This configuration enables the LDO circuit 200 to maintain a high gate-to-source voltage $V_{GS}$, and therefore to achieve low dropout at low output voltages.

In addition, the LDO circuit 200 may further include an external large output capacitor $C_{LOAD}$ electrically coupled between the output node and the system ground. The equivalent series resistance ($R_{ESR}$) of the output capacitor $C_{LOAD}$ can suppress the undershoot and overshoot of the output voltage (e.g., the power supply voltage VDDPST1) of the LDO circuit 200. While the LDO circuit 200 depicted in FIG. 2 is the NMOS LDO working as the current sink, in some other embodiments, it is also possible to apply a p-channel MOS (PMOS) architecture to implement a PMOS LDO working as the current source.

Figure 3:
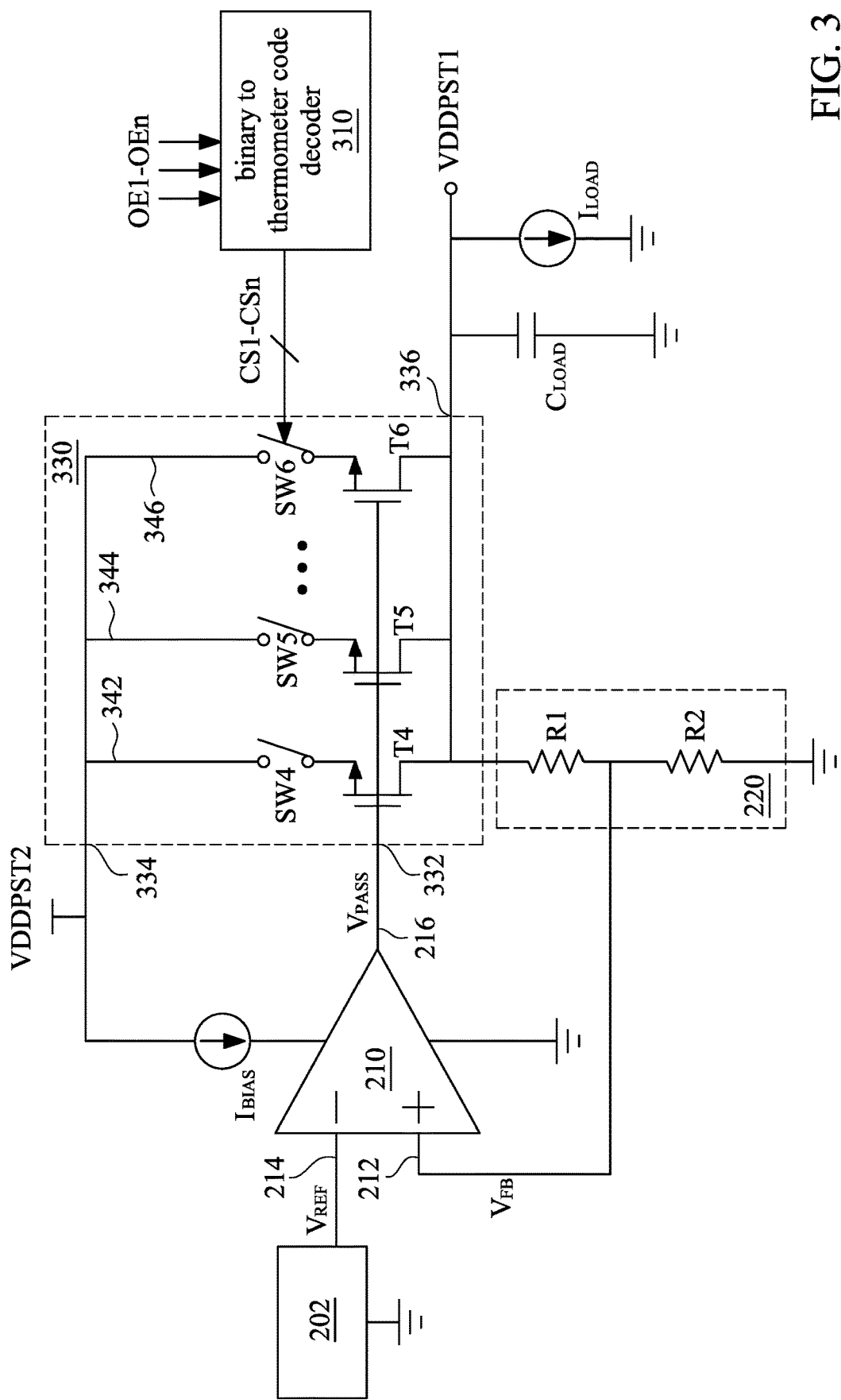
FIG. 3 is a diagram illustrating an exemplary LDO circuit, in accordance with some embodiments of the present disclosure.

FIG. 3 is a diagram illustrating another exemplary LDO circuit 200 using a PMOS architecture, in accordance with some embodiments of the present disclosure. As shown in FIG. 3, in the case of the PMOS architecture, the LDO circuit 200 also includes the operational amplifier 210, the voltage divider circuit 220, and a switchable pass gate circuit 330 having multiple legs 342, 344, and 346. Legs 342, 344, and 346 respectively include PMOS transistors T4, T5, T6 and switches SW4, SW5, and SW6. The switches SW4, SW5, and SW6 are respectively coupled to the PMOS transistors T4, T5, T6 in series and configured to be on or off to enable corresponding current paths. As shown in FIG. 3, the current paths of the legs 342, 344, and 346 are connected in parallel between the voltage divider circuit 220 and a power reference node, such as the power supply line receiving the inputted power supply voltage VDDPST2. Similar to the embodiments of FIG. 2, in order to regulate the desired power supply voltage VDDPST1, the operational amplifier 210, the voltage divider circuit 220, and the switchable pass gate circuit 330 form the feedback loop configured to control the drain-to-source resistance $R_{DS}$ of the switchable pass gate circuit 330. As the power supply voltage VDDPST2 approaches the desired output voltage power supply voltage VDDPST1, the operational amplifier 210 is configured to drive the gate-to-source voltage $V_{GS}$ more negative and lower the drain-to-source resistance $R_{DS}$ to maintain the regulation.

Similar to the embodiments of FIG. 2, the switches SW4, SW5, and SW6 within the switchable pass gate circuit 330 can be turned on or off separately to shift the driving capability. When different numbers of the switches SW4, SW5, and SW6 are on, corresponding one or more PMOS transistors T4, T5 and T6 are coupled between the power supply line receiving the power supply voltage VDDPST2 and the output node of the LDO circuit 200. Accordingly, the operational amplifier 210 is configured to drive, by the gate signal $V_{PASS}$, the parallel-coupled PMOS transistors T4, T5 and T6 in the switchable pass gate circuit 330.

In the embodiments of FIG. 3, the feedback resistors R1 and R2 are also coupled in series to form the voltage divider circuit 220 and configured to scale the outputted power supply voltage VDDPST1 to provide the feedback voltage $V_{FB}$ in the feedback loop to the input terminal 212 (e.g., a positive input terminal) of the operational amplifier 210. Accordingly, the operational amplifier 210 compares the feedback voltage $V_{FB}$ with the reference voltage $V_{REF}$ received from the input terminal 214 (e.g., a negative input terminal) of the operational amplifier 210 and amplifies the error detected between the feedback voltage $V_{FB}$ with the reference voltage $V_{REF}$. Via the feedback loop, when the outputted power supply voltage VDDPST1 deviates from the desired value, the operational amplifier 210 is configured to drive the switchable pass gate circuit 330 to bring the power supply voltage VDDPST1 back to the proper value.

The output terminal 216 of the operational amplifier 210 is coupled to the switchable pass gate circuit 330. Particularly, the switchable pass gate circuit 330 includes a control electrode 332 that is coupled to the output terminal 216 of the operational amplifier 210. The switchable pass gate circuit 330 includes a first electrode 334 connected to the power supply line receiving the inputted power supply voltage VDDPST2 and a second electrode 336 connected to the output node of the LDO circuit 200. In the embodiments of FIG. 3, the control electrode 332 is coupled to gate terminals of the PMOS transistors T4, T5 and T6, and the first electrode 334 and the second electrode 336 are coupled to source terminals (via the switches SW4, SW5, and SW6) and drain terminals of the PMOS transistors T4, T5 and T6.

Similar to the embodiments of FIG. 2, the feedback voltage $V_{FB}$ present at the input terminal 212 of the operational amplifier 210 is a fraction of the outputted power supply voltage VDDPST1 of the LDO circuit 200 and is determined based on the ratio of resistance values of the feedback resistors R1 and R2. The operational amplifier 210 is configured to drive the switchable pass gate circuit 330 by providing the gate signal $V_{PASS}$ to gate terminals of the PMOS transistors T4, T5 and T6 according to the feedback voltage $V_{FB}$ and the reference voltage $V_{REF}$. Accordingly, the switchable pass gate circuit 330 operates at an appropriate operating point that ensures the outputted power supply voltage VDDPST1 at the output node is at the correct voltage. When the operating current or other conditions change, the operational amplifier 210 modulates the switchable pass gate circuit 330 to adjust the dropout voltage accordingly.

As shown in FIG. 3, the switchable pass gate circuit 330 may be configured to provide different current paths via legs 342, 344, and 346 through the PMOS transistors T4, T5 and T6. By enabling or disabling one or more corresponding switches SW4, SW5, and SW6, the LDO circuit 200 is able to adjust the driving capacity of the switchable pass gate circuit 330 in response to the changes of the operating current or other conditions. Accordingly, the gate signal $V_{PASS}$ of the operational amplifier 210 and the associated overdrive voltage of the power transistors T4, T5 and T6 can be controlled within the desired range.

As shown in FIG. 3, in some embodiments, one or more output enable (OE) signals OE1-OEn from corresponding OE pins can be used for shifting the driving capacity. For example, when one or more OE pins are enabled, the shifting level of the LDO circuit 200 can be determined according to the output enable signals OE1-OEn received from the OE pins. In some embodiments, the OE pins may be set by the user based on a driving factor look-up table.

Particularly, the LDO circuit 200 may further include a binary-to-thermometer code decoder 310 configured to receive the output enable signals OE1-OEn from corresponding OE pins and convert the binary code into control signals CS1-CSn for controlling the switches SW4-SW6, to select the number of switches SW4-SW6 to be on to provide the current paths. Accordingly, in response to the output enable signals OE1-OEn, the switches SW4-SW6 can be dynamically controlled. In some embodiments, the binary-to-thermometer code decoder 310 may include a logic circuit to perform certain logic operations for the binary-to-thermometer conversion, such as AND, OR, XOR, NAND, NOR, ADD, and SUB operations, to determine the shifting level of the LDO circuit 200. Accordingly, the binary-to-thermometer code decoder 310 can determine one of the modes as the selected mode according to output enable signals OE1-OEn received from the output enable pins. Based on the selected mode, the binary-to-thermometer code decoder 310 outputs respective control signals CS1-CSn to the switches SW4-SW6 to selectively turn on or turn off the switches SW4-SW6.

Figure 4:
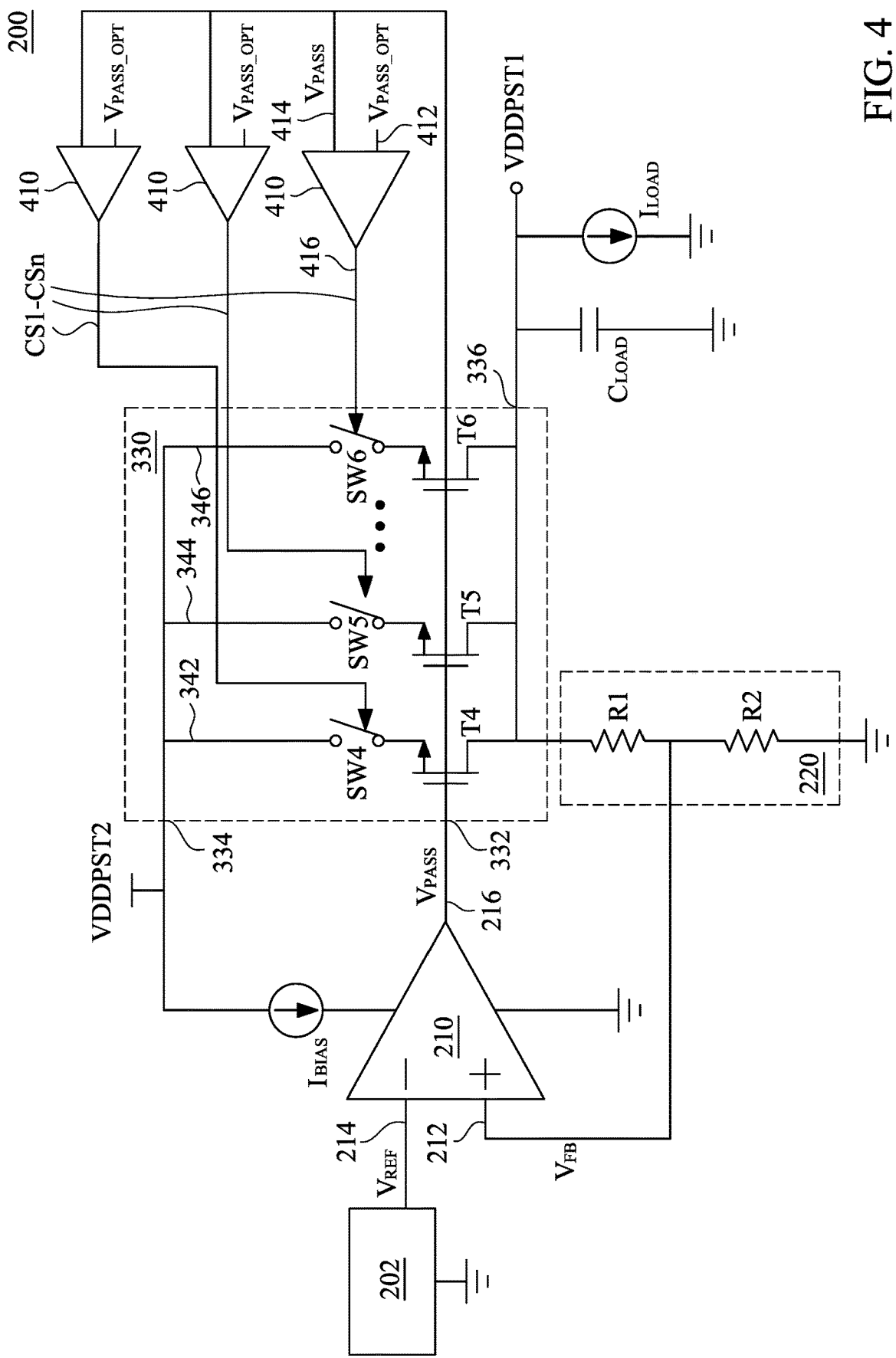
FIG. 4 is a diagram illustrating an exemplary LDO circuit, in accordance with some embodiments of the present disclosure.

Reference is made to FIG. 4. FIG. 4 is a diagram illustrating another exemplary LDO circuit 200, in accordance with some embodiments of the present disclosure. As shown in FIG. 4, the LDO circuit 200 in FIG. 4 further includes multiple hysteresis comparators 410 for generating the control signals CS1-CSn, in which each hysteresis comparator 410 is coupled to one corresponding switch SW4-SW6 to adjust the driving capacity of the switchable pass gate circuit 330. A first input terminal 412 of the hysteresis comparator 410 is configured to receive a predetermined optimized pass voltage signal $V_{PASS\_OPT}$ (e.g., 0.5V). A second input terminal 414 of the hysteresis comparator 410 is connected to the output terminal 216 of the operational amplifier 210 to receive the gate signal $V_{PASS}$. Accordingly, the hysteresis comparators 410 are configured to respectively generate and output control signals CS1-CSn via an output terminal 416 by comparing the feedback gate signal $V_{PASS}$ with the optimized pass voltage signal $V_{PASS\_OPT}$, to separately turn on or off the switches SW4-SW6 in the current paths. As shown in FIG. 4, the hysteresis comparators 410, the operational amplifier 210 and the switchable pass gate circuit 330 in FIG. 4 may form an analog automatic loop, achieving a background calibration. By using the hysteresis comparators 410, the gate signal $V_{PASS}$ can be controlled within a voltage range corresponding to the optimized pass voltage signal $V_{PASS\_OPT}$.

Figures 5A, 5B:
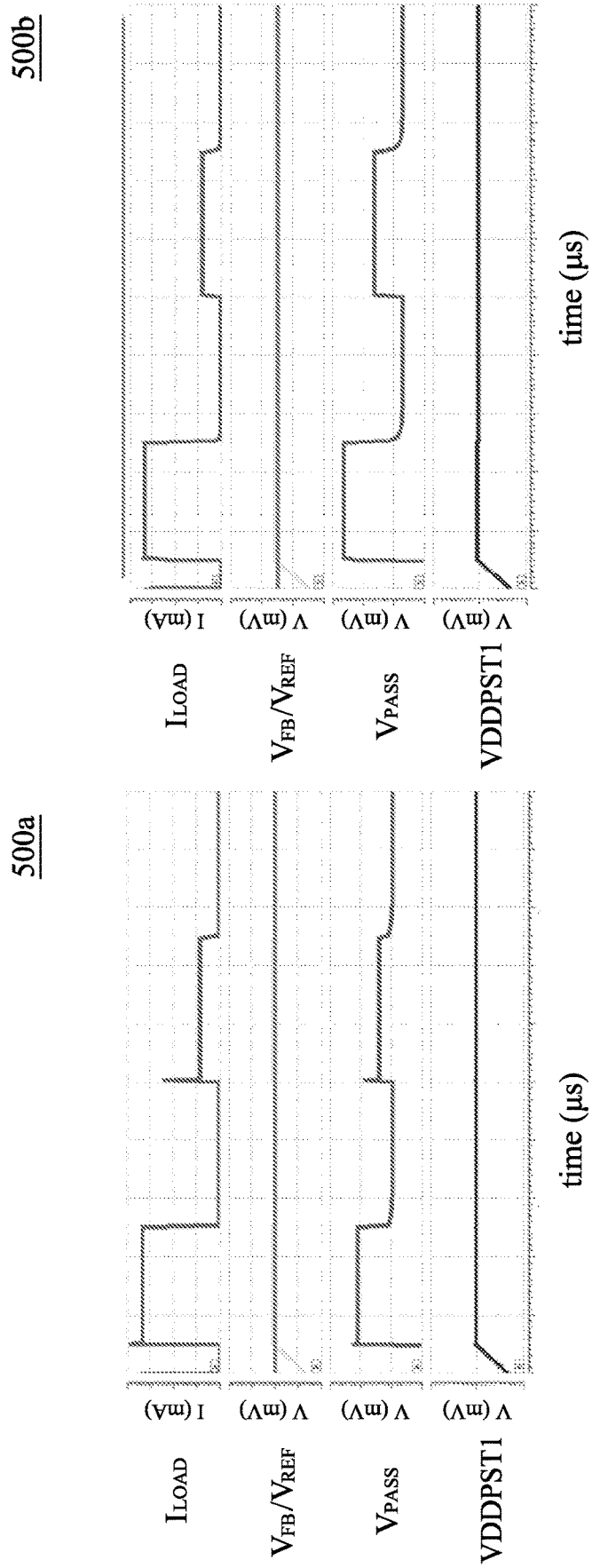
FIG. 5A and FIG. 5B are exemplary waveform diagrams illustrating voltage and current signals in the LDO circuit, in accordance with some embodiments of the present disclosure.

FIG. 5A and FIG. 5B are exemplary waveform diagrams 500a and 500b illustrating voltage and current signals in the LDO circuit 200 with and without the hysteresis comparators 410, in accordance with some embodiments of the present disclosure. As depicted in the waveform diagram 500a, a voltage VDDPST1 outputted by the LDO circuit 200 rises in an initialing stage and then is kept at a stable level in the steady state, in which the feedback voltage $V_{FB}$ is equal to the reference voltage $V_{REF}$. In addition, in response to a varying load current $I_{LOAD}$, the operational amplifier 210 outputs and adjusts the gate signal $V_{PASS}$ accordingly to drive the power transistor(s) in the switchable pass gate circuit 330 of FIG. 4 and to keep the voltage VDDPST1 stable at the desired level. As shown in FIG. 5A, the LDO circuit 200 with the hysteresis comparators 410 is able to provide an optimized range (e.g., 0.5V±0.1V) for the gate signal $V_{PASS}$ and an optimized range (e.g., 0.2V±0.1V) for the overdrive voltage. On the other hand, as shown in FIG. 5B, the LDO circuit 200 without the hysteresis comparators 410 may have a wider, and thus less desirable, range (e.g., 0.34V-0.73V) for the gate signal $V_{PASS}$ during the operations.

Figure 6:
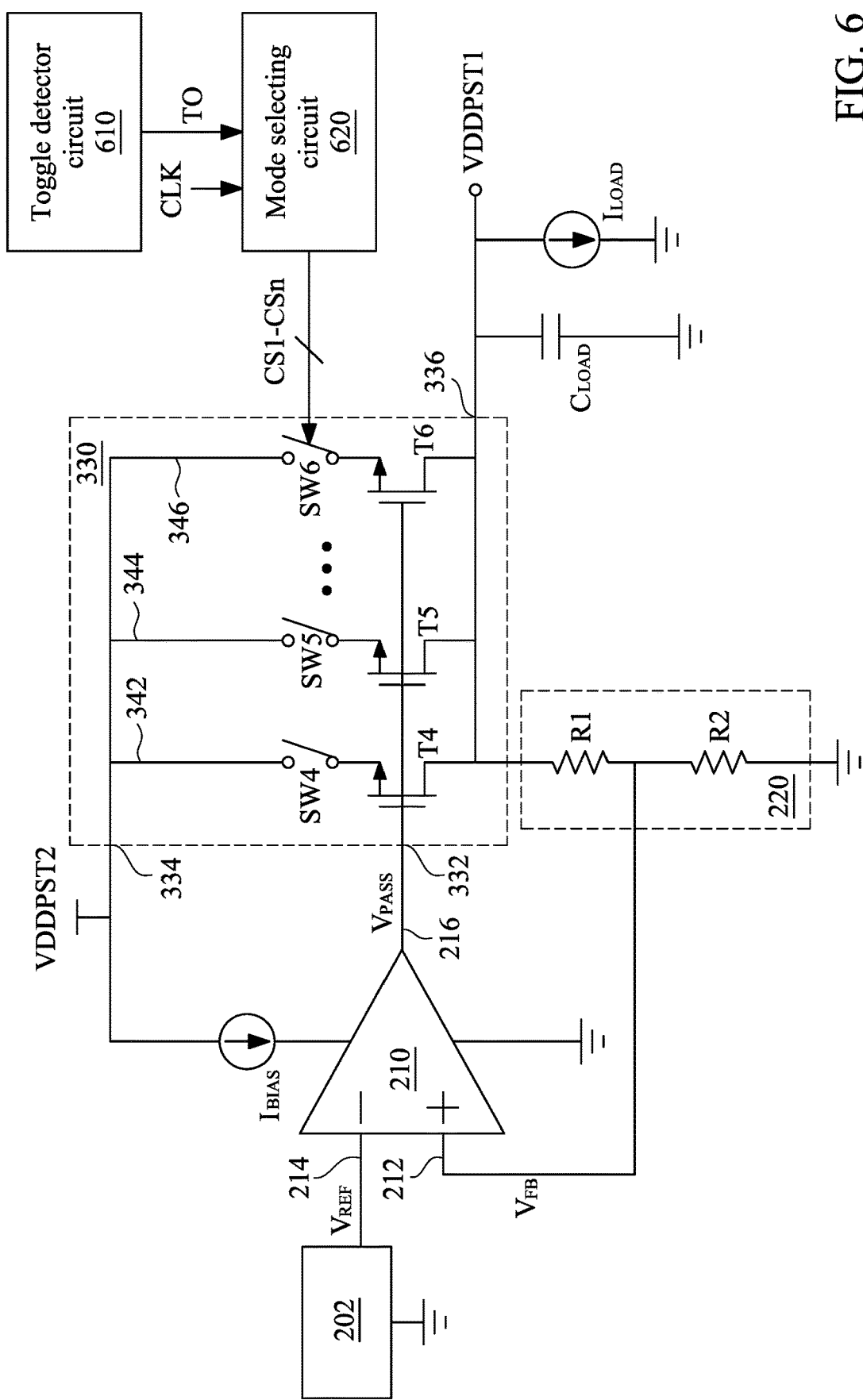
FIG. 6 is a diagram illustrating an exemplary LDO circuit, in accordance with some embodiments of the present disclosure.

Reference is made to FIG. 6. FIG. 6 is a diagram illustrating another exemplary LDO circuit 200, in accordance with some embodiments of the present disclosure. As shown in FIG. 6, the LDO circuit 200 in FIG. 6 further includes a toggle detector circuit 610 and a mode selecting circuit 620 for outputting the control signals CS1-CSn. In some embodiments, the selected mode is determined according to a toggle rate. The toggle rate is the number of toggles, i.e., transitions between the logic value 0 and the logic value 1 of a circuit cell, per unit of time or within a clock period. A clock signal (e.g., a reference clock signal with frequency of 3 MHz-24 MHz) CLK received by the mode selecting circuit 620 can be used for counting the toggle rate. The toggle rate may be expressed as a percentage, or million transitions per second (MTPS), which reflects how often an output changes relative to a given input or clock input. For example, a toggle rate of 100% means that on average the output toggles once during every clock cycle.

In some embodiments, the toggle detector circuit 610 is configured to detect the toggles by monitoring one or more components in the I/O device 100 of FIG. 1, and to detect a number of times that the output toggles from the logic value 0 to the logic value 1 and/or the logic value 1 to the logic value 0. For example, the high side logic circuit 140 and the low side logic circuit 150 of the I/O device 100 in FIG. 1 may include one or more inverters. The toggle detector circuit 610 may monitor the one or more of the inverters to detect a number of times that the monitored output toggles from high to low and/or low to high. The toggle detector circuit 610 thus generates the toggle output signal TO based on the detected number of times.

Accordingly, the mode selecting circuit 620 may calculate the toggle rate according to the toggle output signal TO and the clock signal CLK, and output corresponding control signals CS1-CSn. Thus, the switchable pass gate circuit 330 can operate in different modes to provide different driving capacities based on the toggle rate. For example, in different modes, different sets of switches within the switchable pass gate circuit 330 are enabled accordingly to set the driving capacity of the LDO circuit 200 based on the toggle rate.

Figure 7:
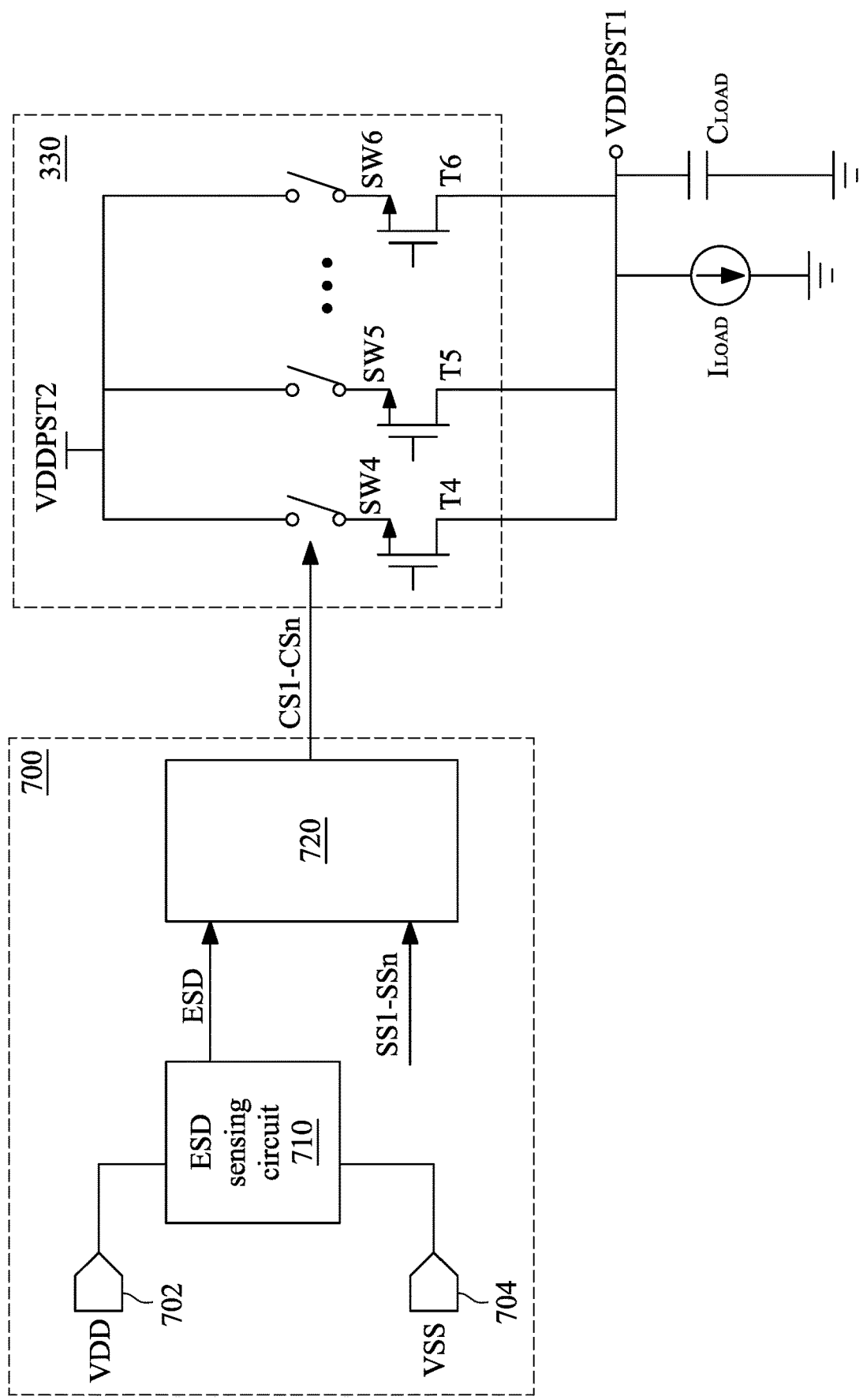
FIG. 7 is a diagram illustrating an exemplary Electrostatic Discharge (ESD) protection circuit, in accordance with some embodiments of the present disclosure.

FIG. 7 is a diagram illustrating an exemplary Electrostatic Discharge (ESD) protection circuit 700, in accordance with some embodiments of the present disclosure. Electrostatic Discharge may cause serious issues and potentially destroy the integrated circuit in the semiconductor devices. Particularly, extremely high voltages can develop in the vicinity of integrated circuits due to the build-up of static charges. When the electrostatic charges are discharged, a high current is produced at package nodes of the integrated circuit, causing the ESD damage. The duration of the ESD transient may be short and in the order of nanoseconds. Accordingly, conventional circuit breakers cannot react quickly enough to provide adequate protection.

As shown in FIG. 7, an ESD sensing circuit 710 interfaces with the input/output, I/O circuitry, and is electrically coupled between a VDD pad 702 and a VSS pad 704. In some embodiments, the ESD sensing circuit 710 may include a power clamp circuit and may be configured to detect an ESD over-voltage condition. When the ESD over-voltage condition between the VDD pad 702 and the VSS pad 704 is detected, the power clamp circuit may clamp the voltage between the VDD pad 702 and the VSS pad 704 below a maximum voltage. In response to the ESD over-voltage condition, the ESD sensing circuit 710 enables an electrostatic discharge signal ESD outputted to an ESD control circuit 720 coupled to the ESD sensing circuit 710. For example, in some embodiments, when an ESD zap happens, a series RC circuit within the ESD sensing circuit 710 may charge and enable the electrostatic discharge signal ESD to the ESD control circuit 720.

In addition, the ESD control circuit 720 also receives, from switch control pins, switch selecting signals SS1-SSn for controlling the switchable pass gate circuit 330 under normal operation. As described in the embodiments of FIGS. 3, 4, and 6, the switch selecting signals SS1-SSn may be obtained by a binary-to-thermometer code decoder, a hysteresis comparator, or a mode selecting circuit 620 to selectively turn on or turn off the switches SW4-SW6 based on the selected mode and the determined driving capacity under normal operation.

The ESD control circuit 720 may include one or more logic circuits configured to output the control signals CS1-CSn according to the electrostatic discharge signal ESD and the switch selecting signals SS1-SSn. When the electrostatic discharge signal ESD is disabled, the ESD protection circuit 700 operates at a normal mode. The control signals CS1-CSn are outputted according to the switch selecting signals SS1-SSn received from the switch control pins. When the electrostatic discharge signal ESD is enable, the ESD protection circuit 700 operates at the ESD zap mode and is configured to output the control signals CS1-CSn to turn off the switches SW4-SW6.

For example, the logic circuit may include an OR gate performing logical OR operations for the switchable pass gate circuit 330 functioning as a current source circuit, such as the LDO circuit 200 in FIG. 3. In some other embodiments, the logic circuits may include an NOR gate performing logical NOR operations for the switchable pass gate circuit 330 functioning as a sink current circuit, such as the LDO circuit 200 in the embodiments of FIG. 2. Accordingly, during an ESD zap, the ESD protection circuit 700 is activated to disconnect the current paths to protect the system from damages.

Figure 8:
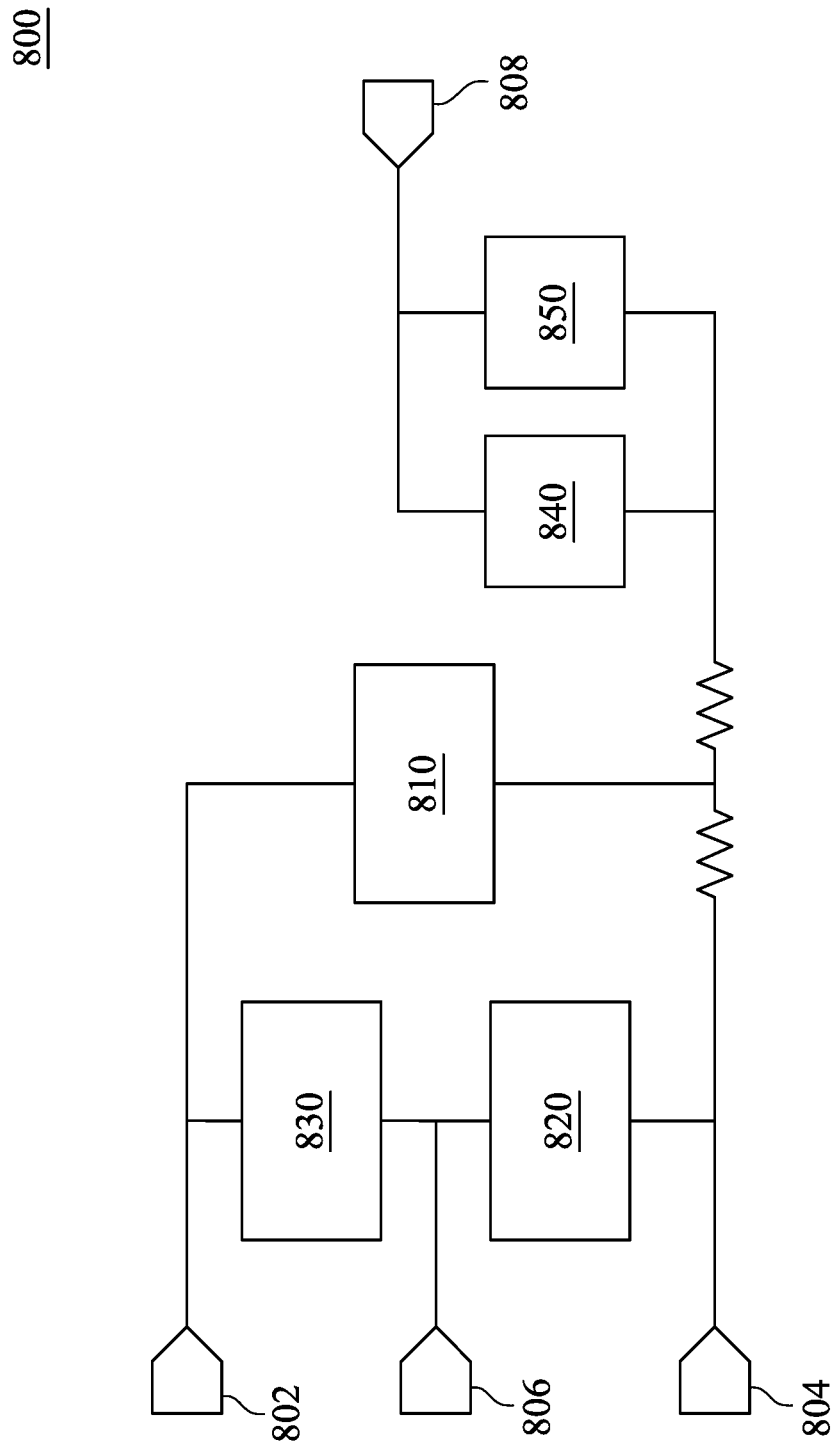
FIG. 8 illustrates a top view of an exemplary layout applied to the LDO circuit, in accordance with some embodiments of the present disclosure.

Reference is made to FIG. 8. FIG. 8 illustrates a top view of an exemplary layout 800, which can be applied to the LDO circuit 200 in accordance with some embodiments of the present disclosure. In some embodiments, the layout 800 can be applied to the LDO circuit 200 with its output terminal connected to an external pad, bump, or printed circuit board (PCB) accessible to an off-chip circuitry. As shown in FIG. 8, a first power clamp circuit 810 is connected between a pin 802 connected to the power rail receiving the I/O voltage VDDIO, and a pin 804 connected to the power rail receiving the low reference voltage VSS. A second power clamp circuit 820 is connected between an output pin 806 of the LDO circuit 200 functioning as the current source for providing the intermediate voltage (e.g., VDDPST1) outputted by the LDO circuit 200, and the pin 804. In some embodiments, the power clamp circuit 820 may be a high/medium voltage power clamp. One or more PMOS switches 830 are connected between the output pin 806 and the pin 802 receiving the I/O voltage VDDIO.

In addition, a third power clamp circuit 840 is connected between another output pin 808 of the LDO circuit 200 functioning as the sink current, and the pin 804. In some embodiments, the power clamp circuit 840 may be a low/medium voltage power clamp. One or more NMOS switches 850 are connected between the output pin 808 for providing the intermediate voltage (e.g., VDDPST1) outputted by the LDO circuit 200 and the pin 804.

In some embodiments, a P+ pickup ring may surround the drain and source regions of the NMOS switches 850. Similarly, a N+ pickup ring may surround the drain and source regions of the PMOS switches 830. In some embodiments, the width of the N+ or P+ pickup ring may be within 0 um to 5 um. A vertical edge space for each NMOS or PMOS transistor may be between 0 um to 10 um. In some embodiments, the aspect ratio for each transistor stage is greater than or equal to 3:1.

Accordingly, PMOS switches 830 and NMOS switches 850 in the layout 800 may form a 2-stage pass gate structure with separate oxide definition (OD) structures in the OD layer. In at least one example, the term "oxide definition (OD)" refers to an active region for a transistor, i.e., the area where a source, a drain, and a channel under a gate of the transistor are formed. In some examples, an OD structure is between insulating regions, such as shallow trench isolation (STI), field oxide (FOX) areas, or other suitable electrically insulating structures. The power clamp circuits 810, 820 and 840 can be configured to clamp the voltage between their two terminals to protect PMOS switches 830 and NMOS switches 850 during power-to-power ESD event.

Figure 9:
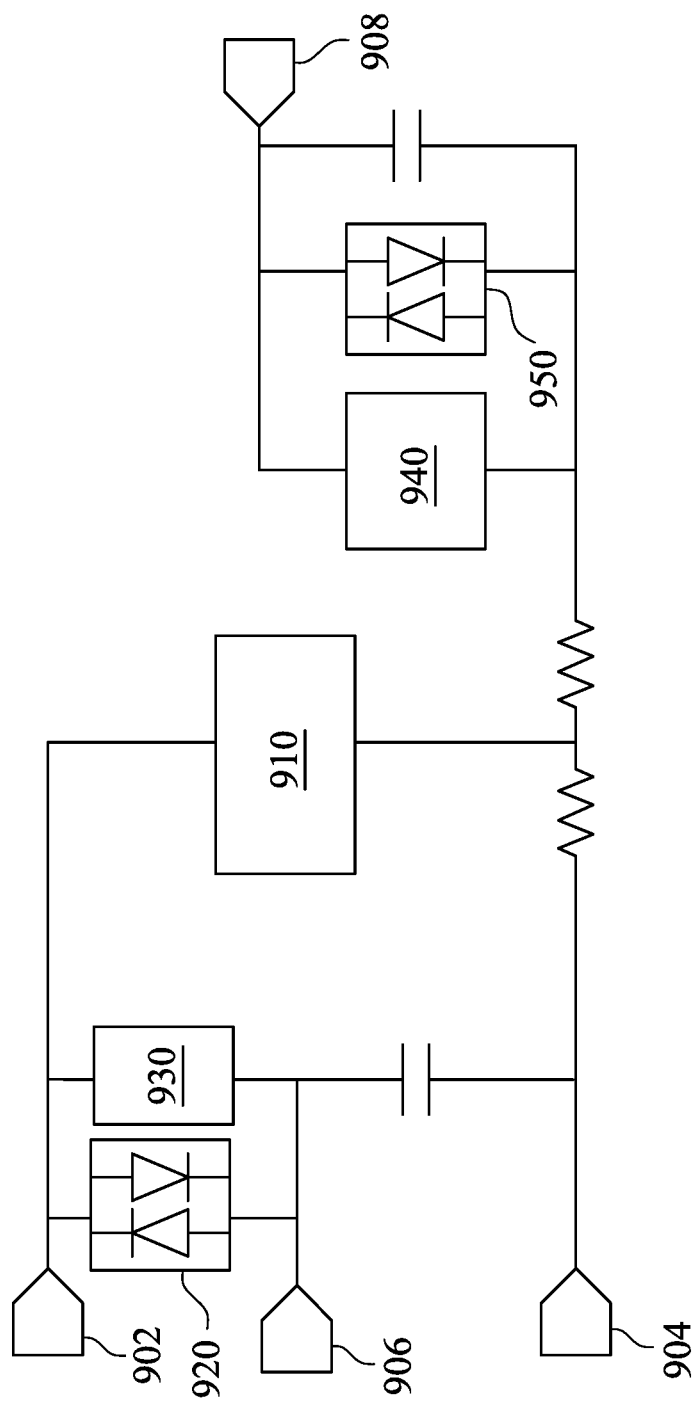
FIG. 9 illustrates a top view of an exemplary layout applied to the LDO circuit, in accordance with some embodiments of the present disclosure.

Reference is made to FIG. 9. FIG. 9 illustrates a top view of another exemplary layout 900, which can be applied to the LDO circuit 200 in accordance with some embodiments of the present disclosure. In some embodiments, the layout 900 in FIG. 9 is applied to the LDO circuit 200 with its output terminal connected to on-chip internal circuitry. As shown in FIG. 9, a first power clamp circuit 910 is connected between a pin 902 connected to the power rail receiving the power supply voltage VDDPST2, and a pin 904 connected to the power rail receiving the low reference voltage VSS. A first diode protection circuit 920 is connected between an output pin 906 of the LDO circuit 200 functioning as the current source for providing an intermediate voltage (e.g., VDDPST1) outputted by the LDO circuit 200, and the pin 902. One or more PMOS switches 830 are connected between the output pin 906 and the pin 902.

In addition, a second diode protection circuit 940 is connected between another output pin 908 of the LDO circuit 200 functioning as the sink current, and the pin 904. One or more NMOS switches 850 are connected between the output pin 808 for providing the intermediate voltage (e.g., VDDPST1) outputted by the LDO circuit 200 and the pin 904.

Accordingly, the diode protection circuit 920 is configured to protect the PMOS switches 930 from excessive voltage or current when the voltage between the output pin 906 and the pin 902 exceeds a predetermined safety value. The diode protection circuit 940 is configured to protect the NMOS switches 950 from excessive voltage or current when the voltage between the output pin 908 and the pin 904 exceeds the safety value.

Figure 10:
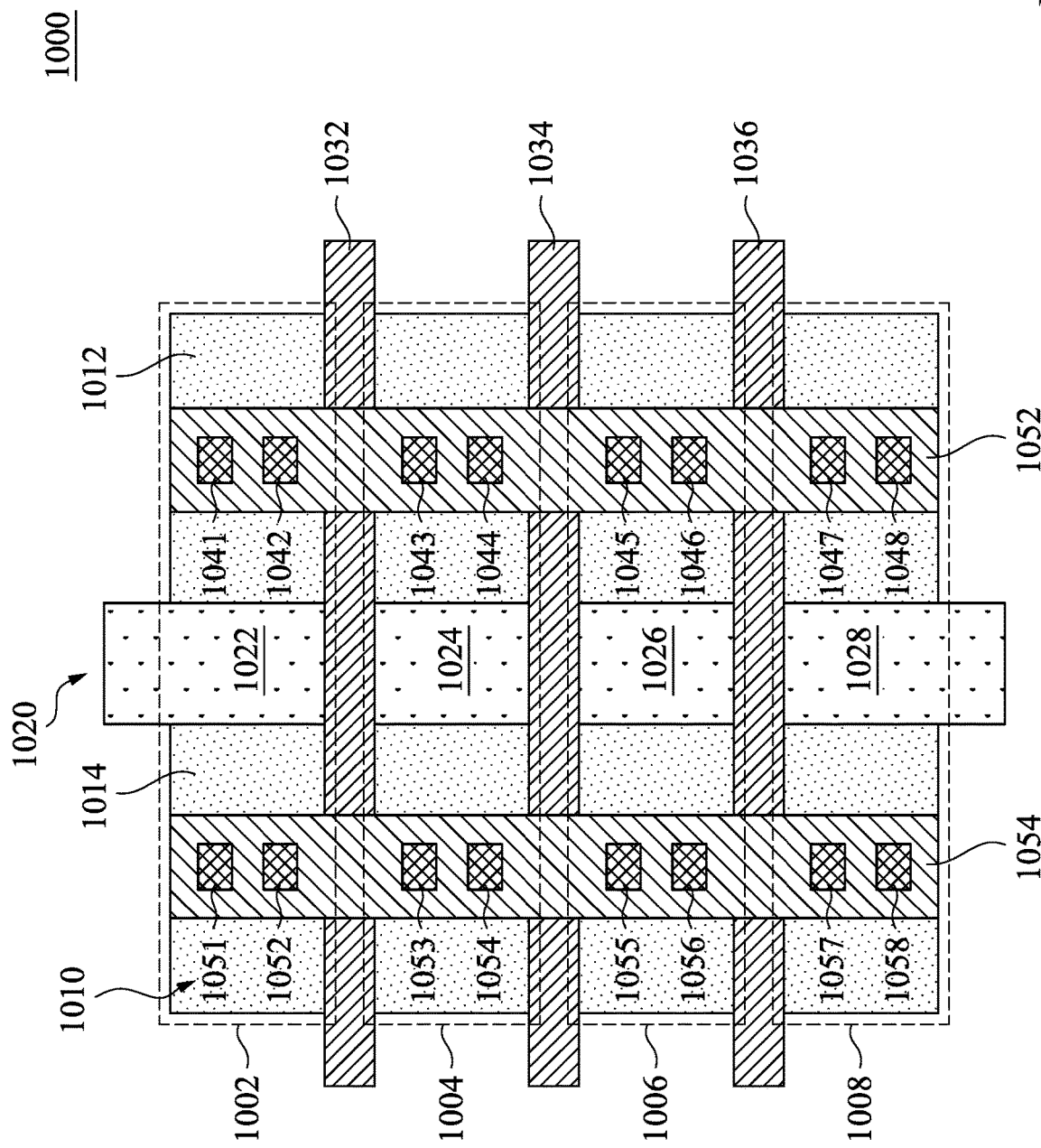
FIG. 10 is an exemplary layout for an NMOS or PMOS transistor used in the LDO circuit, in accordance with some embodiments of the present disclosure.

FIG. 10 is an exemplary layout 1000 for an NMOS or PMOS transistor used in the LDO circuit 200, in accordance with some embodiments of the present disclosure. As shown in FIG. 10, the layout 1000 includes four fingers 1002, 1004, 1006, and 1008 as a unit in the NMOS or PMOS layout to achieve better electron-migration (EM) properties. As shown in FIG. 10, the layout 1000 includes an active region 1010 including a source region 1012 and a drain region 1014, and an active gate strip 1020 formed of polysilicon or other conductive materials such as metals, metal alloys or metal silicides.

In addition, one or more poly cuts can be performed, as depicted by boxes 1032, 1034, and 1036 to separate the active gate strip 1020, forming separated gates 1022, 1024, 1026 and 1028 for the four fingers 1002, 1004, 1006, and 1008. Vias 1041-1048 are placed to respectively connect the source region 1012 of fingers 1002, 1004, 1006, and 1008 to a first conducive feature 1052 in a metal layer above the active region 1010, and vias 1061-1068 are placed to respectively connect the drain region 1014 of fingers 1002, 1004, 1006, and 1008 to a second conducive feature 1054 in the metal layer. It is noted that the number of the vias depicted in FIG. 10 is exemplary and not meant to limit the present disclosure. In some embodiments, a maximum number of vias can be placed to achieve better electron-migration (EM) properties.

In some embodiments, to adjust different output currents, different numbers of fingers of the gates in the NMOS or PMOS can be connected to the ground voltage VSS or the positive supply voltage VDD accordingly. Alternatively stated, the layout may include one or more used MOS fingers and one or more unused MOS fingers. For example, in some embodiments, in order to provide a small current, only a gate, as the used MOS finger, is connected to the control circuit to receive the signal for controlling the MOS on or off, and other gates are connected to the ground voltage VSS or the positive supply voltage VDD to keep the unused MOS fingers off.

Figure 11:
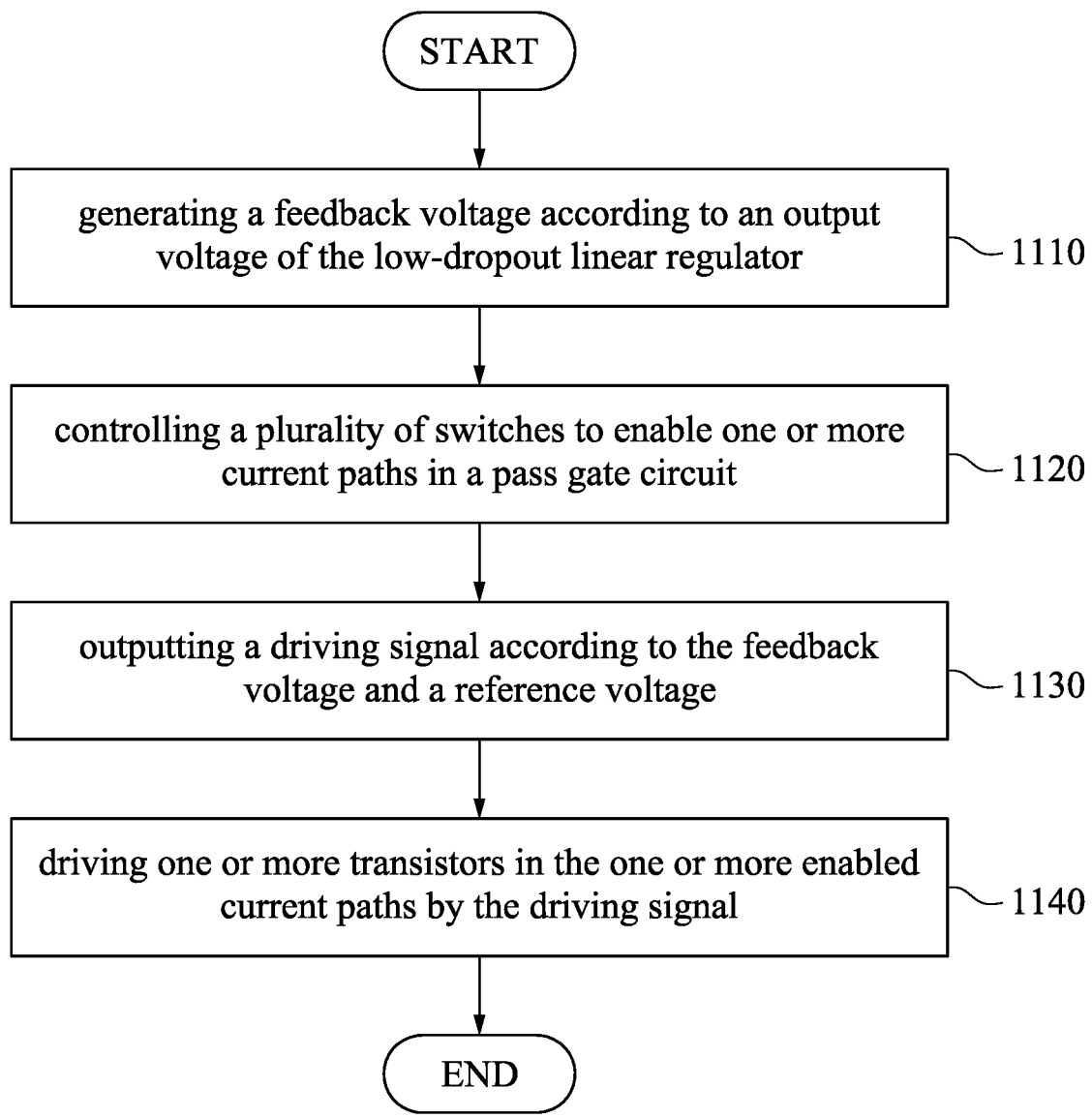
FIG. 11 is an exemplary flowchart of a method for operating a low dropout regulator, in accordance with some embodiments of the present disclosure.

FIG. 11 is an exemplary flowchart of a method 1100 for operating a low dropout regulator, in accordance with some embodiments of the present disclosure. It is understood that additional operations may be performed before, during, and/or after the method 1100 depicted in FIG. 11, and that some other operations may only be briefly described herein. The method 1100 can be performed for the LDO circuit 200 illustrated in any of FIGS. 2-4 and 6, but the present disclosure is not limited thereto.

In operation 1110, a voltage divider circuit (e.g., voltage divider circuit in FIG. 2) generates a feedback voltage (e.g., feedback voltage $V_{FB}$ in FIG. 2) according to an output voltage (e.g., the power supply voltage VDDPST1 in FIG. 2) of the low dropout regulator.

In operation 1120, the LDO circuit 200 controls switches (e.g., switches SW1-SW3 in FIG. 2) to enable one or more current paths in a pass gate circuit (e.g., pass gate circuit 230 in FIG. 2). In some embodiments, the LDO circuit 200 may select one of a plurality of modes as an operating mode according to output enable signals (e.g., OE signals OE1-OEn in FIG. 3) respectively received from output enable pins, and turn on or off the switches in the current paths according to the selected operating mode to enable one or more current paths associated with selected mode. In some embodiments, the low dropout regulator may turn on or off the switches in the current paths according to a toggle rate calculated based on a clock signal. In some embodiments, the low dropout regulator may turn off the switches in the current paths in response to an electrostatic discharge event.

In operation 1130, an operational amplifier (e.g., operational amplifier 210 in FIG. 2) outputs a driving signal (e.g., gate signal $V_{PASS}$ in FIG. 2) according to the feedback voltage and a reference voltage (e.g., the reference voltage $V_{REF}$ in FIG. 2). In some embodiments, the operational amplifier is configured to compare the feedback voltage and the reference voltage to output the driving signal.

In operation 1140, the operational amplifier drives one or more transistors (e.g., transistors T1, T2 and T3 in FIG. 2) in the one or more enabled current paths by the driving signal to adjust a current flowing through the pass gate circuit.

In some embodiments, one or more hysteresis comparators (hysteresis comparators 410 in FIG. 4) in the low dropout regulator compares the driving signal with a third reference voltage (e.g., optimized pass voltage signal $V_{PASS\_OPT}$) to separately turn on or off the switches in the current paths. Accordingly, the driving signal can be regulated within a voltage range corresponding to the third reference voltage.

By the operations described above, a method for operating a low dropout regulator can be performed accordingly to regulate an output voltage of the low dropout regulator, and adjust the driving capability of the low dropout regulator, by selecting a proper operating mode and enabling one or more current paths associated with the operating mode, to optimize the operating point and keep the overdrive voltage in the low dropout regulator within a desired range. In addition, as described above, the power loss of the proposed low dropout regulator is reduced, because the proposed low dropout regulator is achieved without the leakage path causing the leakage current. In some embodiments, the proposed low dropout regulator can further provide an ESD protection function by disabling the switches within the low dropout regulator during the ESD event.

In some embodiments, a circuit is disclosed that includes a voltage divider circuit configured to generate a feedback voltage according to an output voltage, an operational amplifier configured to output a driving signal according to the feedback voltage, a reference voltage, and a pass gate circuit including multiple current paths. The current paths are controlled by the driving signal and connected in parallel between the voltage divider circuit and a power reference node.

In some embodiments, a method for operating a low dropout regulator is disclosed. The method includes: generating a feedback voltage according to an output voltage of the low dropout regulator; controlling a plurality of switches to enable one or more current paths in a pass gate circuit; outputting a driving signal according to the feedback voltage and a reference voltage; and driving one or more transistors in the one or more enabled current paths by the driving signal to adjust a current flowing through the pass gate circuit.

In some embodiments, an input/output device is disclosed that includes one or more voltage level shifters configured to shift one or more first signals within a first voltage range to one or more corresponding second signals within a second voltage range, one or more logic circuits coupled to the one or more voltage level shifters and configured to output one or more switching signals according to the one or more second signal, and a low dropout regulator configured to regulate a power supply voltage provided to the one or more logic circuits or the one or more voltage level shifters. The low dropout regulator includes current paths connected in parallel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising: an operational amplifier configured to output a driving signal according to a feedback voltage associated with an output voltage and a reference voltage; a pass gate circuit comprising a plurality of current paths, the plurality of current paths being controlled by the driving signal, wherein the pass gate circuit is configured to operate in a plurality of modes; and a logic circuit configured to determine a selected mode from the plurality of modes according to a plurality of enable signals respectively received from a plurality of output enable pins, wherein a hysteresis comparator is connected to the operational amplifier and configured to compare the driving signal with a second reference voltage to separately turn on or off switches in the plurality of current paths.

2. The circuit of claim 1, wherein the plurality of current paths respectively comprise transistors and switches connected in series, gate terminals of the transistors are connected to an output terminal of the operational amplifier to receive the driving signal.

3. The circuit of claim 2, wherein the switches in the plurality of current paths being separately turned on or off according to the selected mode.

4. The circuit of claim 3, wherein the selected mode is determined according to a toggle rate calculated based on a clock signal.

5. The circuit of claim 1, wherein the driving signal is within a voltage range corresponding to the second reference voltage.

6. A method for operating a low dropout regulator, comprising:
controlling a plurality of switches to enable one or more current paths in a pass gate circuit;
outputting a driving signal according to a feedback voltage and a reference voltage;
driving one or more transistors in the one or more enabled current paths according to the driving signal; and
comparing, by one or more hysteresis comparators, the driving signal with a second reference voltage to separately turn on or off the plurality of switches.

7. The method of claim 6, further comprising:
comparing, by an operational amplifier, the feedback voltage and the reference voltage to output the driving signal.

8. The method of claim 6, further comprising:
turning on or off the plurality of switches according to an operating mode selected from a plurality of modes according to a plurality of enable signals respectively received from a plurality of output enable pins.

9. The method of claim 6, further comprising:
regulating the driving signal within a voltage range corresponding to the second reference voltage.

10. The method of claim 6, further comprising:
turning on or off the plurality of switches according to a toggle rate calculated based on a clock signal.

11. The method of claim 6, further comprising:
turning off the plurality of switches in response to an electrostatic discharge event.

12. An input/output device, comprising: one or more voltage level shifters configured to output one or more voltage signals; a first logic circuit and a second logic circuit having different supply voltages, and configured to output one or more switching signals according to the one or more voltage signals; a low dropout regulator comprising a plurality of current paths and configured to regulate a power supply voltage provided to one or more of the first logic circuit and the second logic circuit or the one or more voltage level shifters; and a post driver circuit coupled to the first logic circuit and the second logic circuit and configured to output one or more output signals in response to the one or more switching signals, wherein a high supply voltage of the post driver circuit is greater than a high supply voltage of the one or more voltage level shifters.

13. The input/output device of claim 12, wherein the low dropout regulator comprises:
a voltage divider circuit configured to generate a feedback voltage according to the power supply voltage;
an operational amplifier configured to output a driving signal according to the feedback voltage and a reference voltage; and
a pass gate circuit comprising the plurality of current paths, wherein the plurality of current paths respectively comprise transistors and switches connected in series, the transistors including gate terminals connected to an output terminal of the operational amplifier to receive the driving signal, and the switches in the plurality of current paths configured to be separately turned on or off.

14. The input/output device of claim 13, wherein the pass gate circuit is configured to operate in a plurality of modes, the switches in the plurality of current paths being separately turned on or off according to a selected mode.

15. The input/output device of claim 14, wherein the selected mode is determined according to a toggle rate calculated based on a clock signal.

16. The input/output device of claim 13, wherein the low dropout regulator further comprises:
a hysteresis comparator connected to the operational amplifier and configured to compare the driving signal with a second reference voltage to separately turn on or off the switches in the plurality of current paths.

17. The input/output device of claim 16, wherein the driving signal is within a voltage range corresponding to the second reference voltage.

18. The input/output device of claim 12, wherein the first logic circuit and the second logic circuit form a decoding circuit to generate the one or more switching signals for driving the post driver circuit.

19. The input/output device of claim 12, wherein the first logic circuit and the second logic circuit comprise buffer or inverter circuits to generate the one or more switching signals in response to the one or more voltage signals from the one or more voltage level shifters.

* * * * *